US012805381B2

(12) United States Patent
Guevara et al.

(10) Patent No.: US 12,805,381 B2
(45) Date of Patent: Nov. 17, 2026

(54) SEMICONDUCTOR PACKAGES WITH CAVITIES AND METHODS OF MAKING THEREOF

(71) Applicant: Texas Instruments Incorporated, Dallas, TX (US)

(72) Inventors: Rafael Jose L. Guevara, Angeles (PH); Christlyn Faith Hobrero Arias, Mabalacat City (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 837 days.

(21) Appl. No.: 17/815,460

(22) Filed: Jul. 27, 2022

(65) Prior Publication Data

US 2024/0038608 A1 Feb. 1, 2024

(51) Int. Cl.
*H10W 76/40* (2026.01)
*H10P 14/60* (2026.01)
(Continued)

(52) U.S. Cl.
CPC .......... *H10W 76/40* (2026.01); *H10W 70/411* (2026.01); *H10W 74/012* (2026.01);
(Continued)

(58) Field of Classification Search
CPC . H01L 21/56–563; H01L 23/18; H01L 23/24; H01L 23/3107; H01L 23/3121; H01L 23/315; H01L 23/3192; H01L 23/142; H01L 23/49503–49513; H01L 23/498; H01L 23/49805; H01L 21/02107;
(Continued)

(56) References Cited

U.S. PATENT DOCUMENTS

| | | | | |
|---|---|---|---|---|
| 9,614,122 B2 * | 4/2017 | Atanackovic | ........ | H10H 20/825 |
| 2002/0034022 A1 * | 3/2002 | Nakamura | ............ | H10F 39/804 257/E31.127 |

(Continued)

FOREIGN PATENT DOCUMENTS

WO WO-2019208127 A1 * 10/2019 ............. G01L 19/14

OTHER PUBLICATIONS

English translation of Yoshia (WO-2019208127-A1) (Year: 2019).*
U.S. Appl. No. 17/508,009, filed Oct. 22, 2021, Guevara et al. / Texas Instruments Incorporated.

*Primary Examiner* — Zandra V Smith
*Assistant Examiner* — Douglas Yap
(74) *Attorney, Agent, or Firm* — Yudong Kim; Charles F. Koch

(57) ABSTRACT

Semiconductor packages with cavities and methods of making such semiconductor packages are described. The semiconductor package includes a semiconductor die including an interface region where various components configured to interact with an environment surrounding the package can be located. Such components include a humidity sensor, a temperature sensor, a light emitting diode, a solid-state laser, a photodiode, or the like. The semiconductor package includes an opening above the interface region to facilitate proper and adequate operations of the components. The semiconductor package also includes a polymer structure surrounding the interface region, thereby forming the opening. The polymer structure has an uneven inner sidewall profile formed by multiple layers of a polymer material.

31 Claims, 13 Drawing Sheets

(51) Int. Cl.

| | |
|---|---|
| ***H10P 14/68*** | (2026.01) |
| ***H10P 76/00*** | (2026.01) |
| ***H10P 76/20*** | (2026.01) |
| ***H10W 70/40*** | (2026.01) |
| ***H10W 70/60*** | (2026.01) |
| ***H10W 74/01*** | (2026.01) |
| ***H10W 74/10*** | (2026.01) |
| ***H10W 74/15*** | (2026.01) |
| ***H10W 90/00*** | (2026.01) |

(52) U.S. Cl.
CPC ......... *H10W 74/131* (2026.01); *H10W 74/15* (2026.01); *H10P 14/60* (2026.01); *H10P 14/683* (2026.01); *H10P 76/00* (2026.01); *H10P 76/20* (2026.01); *H10P 76/2041* (2026.01); *H10W 70/60* (2026.01); *H10W 90/756* (2026.01)

(58) Field of Classification Search
CPC .... H01L 21/02118–0212; H01L 21/027–0279; H01L 23/16; H01L 23/3178; H10F 19/80–85; H10F 77/30–337; H10F 39/804; H10F 39/806–8067; H05K 1/115; H10W 74/124; H10W 74/134; H10W 74/147; H10W 76/40; H10W 76/42; H10W 76/47; H10W 76/012; H10W 70/411; H10W 90/756; G01L 19/003; G01L 19/08; G01L 19/245; G01L 19/142; G01L 19/143; F16L 15/08; B81C 1/00904; B81C 1/0023; B81C 1/00253; B81B 7/0058; H10P 14/683–687; H10P 14/60–6302
See application file for complete search history.

(56) References Cited

U.S. PATENT DOCUMENTS

| | | | | |
|---|---|---|---|---|
| 2005/0110889 | A1* | 5/2005 | Tuttle | H10F 39/806 257/E31.127 |
| 2006/0046332 | A1* | 3/2006 | Derderian | H01L 24/97 438/28 |
| 2009/0027869 | A1* | 1/2009 | Uchida | B29C 70/72 361/829 |
| 2009/0311485 | A1* | 12/2009 | Uchida | H10F 39/011 428/339 |
| 2010/0055833 | A1* | 3/2010 | Uchida | H10F 39/804 438/107 |
| 2010/0096717 | A1* | 4/2010 | Uchida | H10F 39/804 257/434 |
| 2010/0142169 | A1* | 6/2010 | Uchida | H10F 77/50 361/761 |
| 2011/0096515 | A1* | 4/2011 | Uchida | H10F 39/804 361/748 |
| 2015/0060806 | A1* | 3/2015 | Park | H10K 59/122 257/40 |
| 2016/0068387 | A1* | 3/2016 | Nakanishi | B81C 1/0023 438/51 |
| 2019/0354013 | A1* | 11/2019 | Maruyama | G03F 7/0757 |
| 2020/0098736 | A1* | 3/2020 | Liao | H04B 10/40 |
| 2023/0230966 | A1* | 7/2023 | Chang | H10F 55/00 257/719 |

* cited by examiner

SEMICONDUCTOR PACKAGES WITH CAVITIES AND METHODS OF MAKING THEREOF

TECHNICAL FIELD

The present disclosure generally relates to the field of semiconductor packages, and more particularly to semiconductor packages with cavities and methods of making such semiconductor packages.

BACKGROUND

A semiconductor package is a metal, plastic, glass, or ceramic casing containing one or more semiconductor devices or integrated circuits (ICs). Individual devices or ICs are fabricated on semiconductor wafers before being diced into dies, tested, and packaged. The package provides conductive members (e.g., leads) connecting the devices or ICs to an external environment, such as a printed circuit board (PCB). Moreover, the package provides protection against threats such as mechanical impact and chemical contamination. Also, the package facilitates dissipating thermal energy produced by the devices or ICs, with or without the aid of a heat spreader. Some semiconductor packages are molded out of an epoxy plastic that protects the semiconductor devices and provides mechanical strength for handling of the semiconductor package.

SUMMARY

The present disclosure describes semiconductor packages with cavities and methods of making such semiconductor packages. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a semiconductor package comprises a semiconductor die including an interface region at a top side of the semiconductor die and a polymer structure formed on the top side, which surrounds the interface region and extends from the top side to a first height. The polymer structure has an uneven inner sidewall profile that forms a cavity. The semiconductor packages further comprises an encapsulation structure surrounding the polymer structure and encasing the semiconductor die, where the encapsulation structure extends from the top side to a second height that is less than the first height.

In some embodiments, a method includes applying a first film over a top side of a semiconductor die including an interface region. The first film includes a first protection layer and a first polymer layer, where the first polymer layer faces the top side of the semiconductor die. The method further includes removing a portion of the first polymer layer over the interface region, where a first remaining portion of the first polymer layer includes a first opening with a first area as a result of removing the portion of the first polymer layer. The method further includes attaching a second film to the first remaining portion. The second film includes a second protection layer and a second polymer layer, where the second polymer layer faces the first remaining portion. The method further includes removing a portion of the second polymer layer over the interface region, where a second remaining portion of the second polymer layer includes a second opening with a second area as a result of removing the portion of the second polymer layer. The second area is less than the first area.

In some embodiments, a semiconductor package comprises a semiconductor die including an interface region on a surface of the semiconductor die and a polymer wall formed on the surface. The polymer wall circumscribes the interface region and extends from the surface to a first height, where the polymer wall includes one or more first layers having a first aperture with a first cross-sectional area and one or more second layers having a second aperture with a second cross-sectional area less than the first cross-sectional area. The one or more first layers alternate with the one or more second layers. The semiconductor package further comprises a mold structure encapsulating the semiconductor die. The mold structure extends from the surface to a second height less than the first height.

DETAILED DESCRIPTION

Figure 1A:
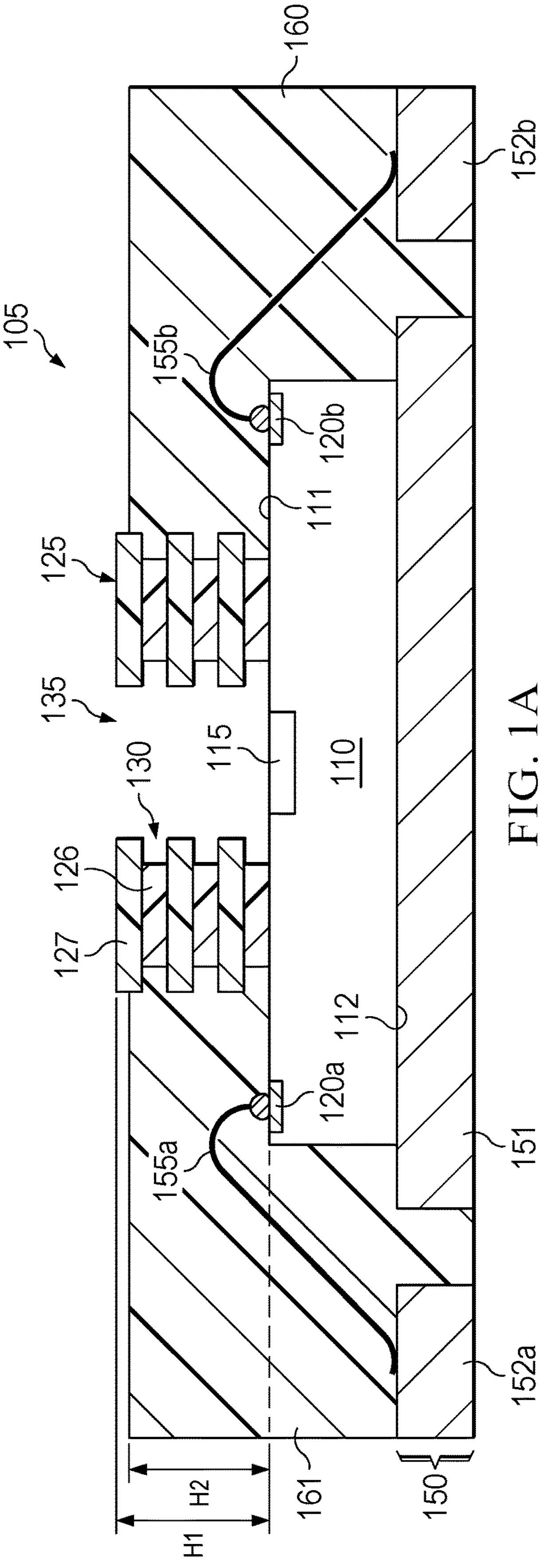
FIGS. 1A through 1D illustrate schematic diagrams of a semiconductor package in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. It is to be understood that the figures and examples are not meant to limit the scope of the present disclosure to such example embodiments, and other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

As used herein, terms such as “first” and “second” are used to arbitrarily distinguish between the elements such terms describe. Thus, these terms in the description and in the claims are not intended to indicate temporal or other prioritization of such elements. Moreover, terms such as “front,” “back,” “top,” “bottom,” “over,” “under,” “vertical,” “horizontal,” “lateral,” “down,” “up,” “upper,” “lower,” or the like, are used to refer to relative directions or positions of features in the semiconductor devices in view of the orientation shown in the figures. For example, “upper” or “uppermost” can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein.

The present disclosure describes semiconductor packages with cavities and methods of making such semiconductor packages. The semiconductor package includes a semiconductor die with an interface region where various components are located, which can be configured to interact with an environment surrounding the semiconductor package. For example, the interface region may include sensors (e.g., a humidity sensor, a temperature sensor, a light sensor), light emitting diodes (LEDs), photodiodes, or a solid-state laser. Accordingly, the semiconductor package includes a cavity (e.g., an opening, an orifice, an aperture) above the interface region to facilitate proper and adequate operations of the components located in the interface region.

It would be desirable to minimize variations in the cavity dimensions (e.g., heights, widths, sidewall slopes) to maintain consistent operations of the components in the interface regions across multitudes of the semiconductor packages. Additionally, or alternatively, the interface region (e.g., the surface of the interface region, the space above the interface region) needs to be clear of any material that may impede the interactions. For example, if a mold material used to encapsulate the semiconductor die settles on the interface region during the semiconductor package assembly process, the mold material may have adverse impact to operations of the components in the interface region—e.g., blocking or reducing interaction areas, generating stress. As such, the cavity may be referred to as a mold free zone.

In some cases, metal wall structures (e.g., electroplated copper structures) surrounding the interface region can be used to form the cavities. The process of making metal wall structures, however, may be relatively costly and subject to process variations—e.g., within wafer (WIW) variations of the metal wall structure heights. Such variations of the metal wall structures may result in mold materials encroaching into the cavity during the assembly process.

The semiconductor package in accordance with the present disclosure includes a polymer structure surrounding the interface region, thereby forming the cavity. The polymer structure includes multiple layers of a polymer material (e.g., polyimide). As described below in more detail, each layer of the polymer material (which may also be referred to as a polymer layer) can be formed using a laminate process. The laminate process applies a sheet of a polymer material over a wafer including semiconductor dies. The sheet of the polymer material is expected to provide an improved thickness uniformity across the wafer—e.g., when compared to the electroplating process of forming the metal wall structures across the wafer. The improved thickness uniformity tends to reduce the height variations of the polymer structure—e.g., the WIW variation of the polymer structure heights. A tighter distribution of the polymer structure heights is expected to make the semiconductor packages less vulnerable to the mold material seepage issues.

Moreover, the polymer structure includes an uneven inner sidewall profile. The uneven inner sidewall profile of the polymer structure is expected to make the semiconductor packages more resilient to the seepage issues—e.g., when compared to structures with a straight sidewall profile. For example, even if the mold material encroaches into the cavity, the uneven sidewall profile can be configured to capture the mold material such that the effective opening of the cavity remains relatively unchanged from the perspectives of the components in the interface region. Additionally, the uneven sidewall profile causes the mold material to travel a longer distance to reach the interface regions such that the risk of the mold materials settling on the interface regions becomes less likely. The laminate process is also expected to be relatively inexpensive—e.g., when compared to the electroplating process.

Figure 1B:
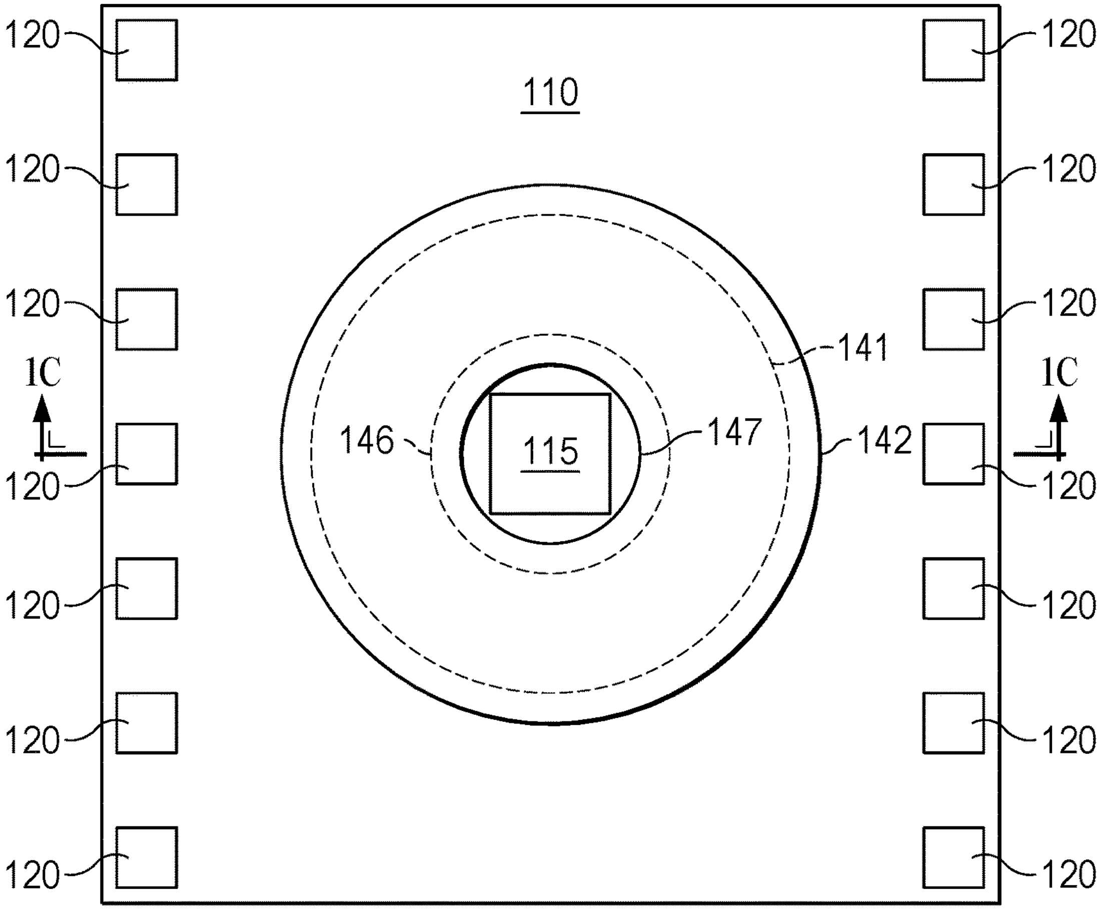
Figure 1C:
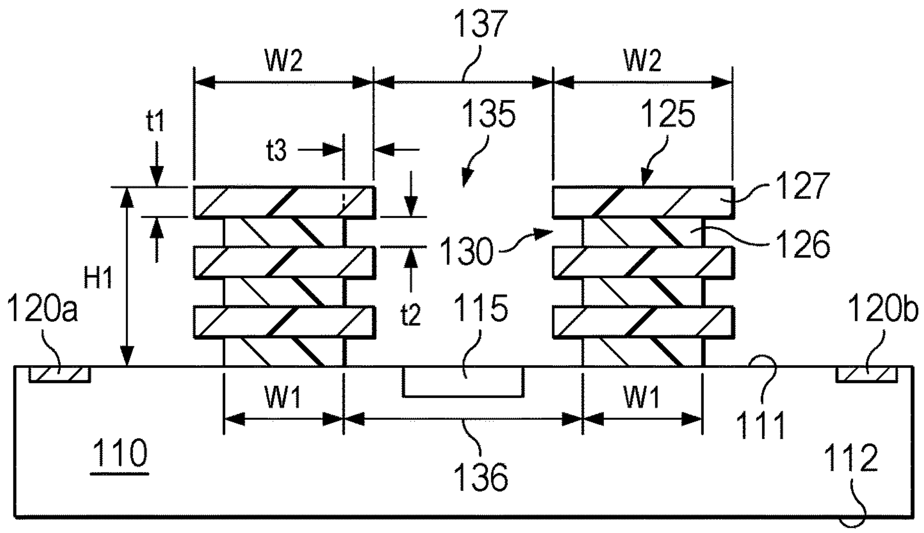
Figure 1D:
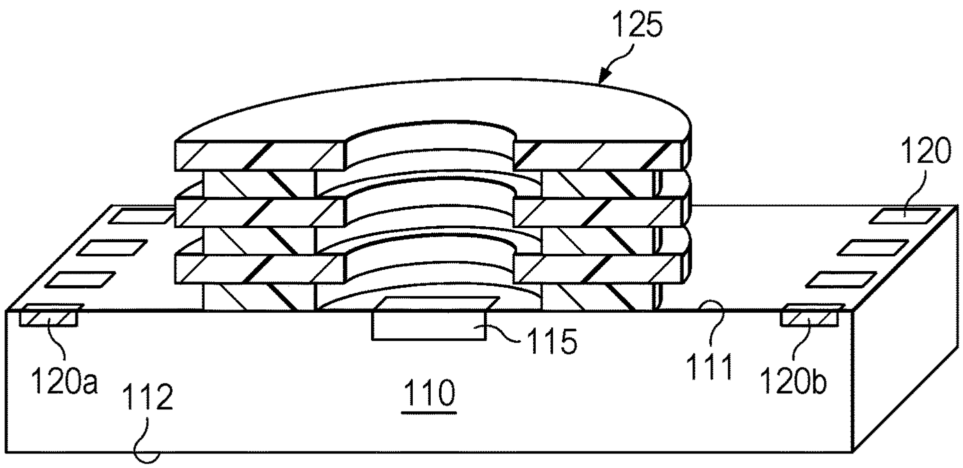

FIGS. 1A through 1D illustrate schematic diagrams of a semiconductor package 105 in accordance with embodiments of the present disclosure. FIG. 1A is a cross-sectional diagram of the semiconductor package 105 that includes a semiconductor die 110 and a polymer structure 125 (or a polymer wall) disposed on the semiconductor die 110. The semiconductor die 110 is attached to a die pad 151 of a lead frame 150. FIG. 1B illustrates a top-down view of the semiconductor die 110 and the polymer structure 125. FIG. 1C illustrates a cross-sectional view of the semiconductor die 110 and the polymer structure 125 across an imaginary line 1C of FIG. 1B. Moreover, FIG. 3D is a three-dimensional schematic diagram of the semiconductor die 110 and the polymer structure 125. FIGS. 1B through 1D omit certain features of the semiconductor package 105, such as the lead frame 150, the bond wires 155, and the encapsulation structure 160 depicted in FIG. 1A. FIGS. 1A through 1D are concurrently described herein to illustrate overall features and the principles of the present disclosure.

Referring to FIG. 1A, the semiconductor package 105 includes a lead frame 150 (or a portion thereof), which may be also referred to as a package substrate. The lead frame 150 includes a die pad 151 to which the semiconductor die 110 is attached and at least one lead finger 152 (also identified individually as lead fingers 152*a/b*) that couples the semiconductor die 110 to the external components or systems—e.g., various components on a PCB to which the semiconductor package 105 is attached. As such, the lead fingers 152 may also be referred to as interconnects. The semiconductor package 105 also includes an encapsulation structure 160 (e.g., a mold structure) surrounding the polymer structure 125 and encasing the semiconductor die 110. The encapsulation structure 160 may including a molding material (e.g., an epoxy compound). In some embodiments, the semiconductor package 105 includes an adhesion layer (not shown) between the semiconductor die 110 and the die pad 151.

The semiconductor die 110 includes a top side (or a first surface) 111 and a bottom side (or a second surface) 112 opposite to the top side 111. Moreover, the semiconductor die 110 includes an interface region 115 at the top side 111. The interface region 115 may include components configured to interact with an environment surrounding the semiconductor package 105. The interaction with the environment may include generating output toward the environment, as well as receiving input from the environment. For example, the components may transmit visible or invisible light (or information carried by the light) toward the environment of the semiconductor package. Additionally, or alternatively, the components may receive a variety of input from the environment of the semiconductor package—e.g., light or information carried by the visible/invisible light, the ambient air to monitor various conditions outside the semiconductor package 105. In some embodiments, the components include sensors (e.g., a humidity sensor, a temperature sensor, a photosensor), light emitting diodes (LEDs), photodiodes, photodetectors, a solid-state laser, or a combination thereof.

The semiconductor die 110 may include circuitry (not shown) that operates with the components in the interface region 115—e.g., controlling the components, transmitting or receiving information to or from the components. The semiconductor die 110 also includes bond pads 120 (also identified individually as bond pads 120*a/b*) that are coupled to the circuitry (or to the components in the interface region 115). Bond wires 155 (also identified individually as bond wires 155*a/b*) connect the bond pads 120 of the semiconductor die 110 to the lead fingers 152.

The polymer structure 125 disposed on the top side 111 surrounds (or circumscribes) the interface region 115 and extends from the top side 111 to a first height (denoted as H1 in FIGS. 1A and 1C). In some embodiments, the first height of the polymer structure 125 range between approximately 100 to 450 microns (micrometers, μm)—e.g., 120 to 180 microns. The term "approximately," as used herein, may refer to ±5% to ±10% variations of the recited values in some cases. In other cases, the term "approximately" may refer to ±10% to ±20% variations of the recited values. The encapsulation structure 160 extends from the top side 111 to a second height (denoted as H2 in FIG. 1A), which is less than the first height (H1).

The polymer structure 125 may include two or more layers of a light-sensitive (or photosensitive) polymer material stacked on top of another—e.g., six (6) layers as shown in FIGS. 1A through 1C. In some embodiments, the light-sensitive polymer material includes polyimide, polybenzoxazole (PBO), benzocyclobutene (BCB), or a combination thereof. The thickness of individual layers (e.g., light-sensitive polyimide layers) may range between approximately 50 to 70 microns.

The polymer structure 125 includes a cavity 135 (e.g., an opening, an orifice, an aperture) through which the interface region 115 is exposed to an environment (ambient or surroundings) of the semiconductor package 105. The components in the interface region 115 can interact with the environment through the cavity 135. The polymer structure 125 may have an uneven (e.g., non-straight) inner sidewall profile—e.g., a sidewall profile with U-shaped corrugations, a ribbed surface, an undulating surface, or a combination thereof. In the example embodiment depicted in FIGS. 1A through 1D, the uneven inner sidewall profile includes U-shaped grooves (or troughs) 130. The uneven inner sidewall profile with at least one groove is configured to capture (or retain) a mold compound of the encapsulation structure 160—e.g., if the mold compound encroaches into the cavity 135 during the semiconductor package assembly process.

As shown in FIGS. 1B and 1C, the cavity 135 may have a first opening 136 and a second opening 137. The first opening 136 has a first area 146 (cross-sectional area) and the second opening 137 has a second area 147 (cross-sectional area) that is less than the first area 146. The polymer structure 125 may be considered to include one or more base layers 126 (or first layers 126) corresponding to the first opening 136 of the cavity 135 and one or more protruded layers 127 (or second layers 127) corresponding to the second opening 137 of the cavity 135. In this regard, the one or more protruded layers 127 include extended portions (or protruded portions) with respect to the edges of the one or more base layers 126. Moreover, the one or more base layers 126 adjacent to the one or more protruded layers 127 form troughs (or grooves) configured to retain a mold compound of the mold structure. As shown in FIGS. 1A through 1D, individual base layers 126 alternate with individual protruded layers 127, or vice versa.

The polymer structure 125 may form a ring shape surrounding the interface region 115 as shown in FIGS. 1B and 1D. In other words, the first layers 126 may form a first ring 141 (or a first footprint of the first layers 126) and the second layers 127 may form a second ring 142 (or a second footprint of the second layers 127), respectively. The top-down view of FIG. 1B depicts the first ring 141 with broken lines and the second ring 142 with solid lines, respectively. The first ring 141 has a first width (denoted as W1 in FIG. 1C), and the second ring 142 has a second width (denoted as W2 in FIG. 1C). In some embodiments, the first width ranges between approximately 30 to 60 microns and the second width ranges between 60 to 120 microns. The first ring 141 defines the first area 146 uncovered by the first ring 141 (or the first footprint of the first layers 126). In some embodiments, the first area 146 has a diameter ranging between approximately 120 to 140 microns. Similarly, the second ring 142 (or the second footprint of the second layers 127) defines the second area 147 uncovered by the second ring 142. In some embodiments, the second area 147 has a diameter ranging between approximately 80 to 100 microns. A common area to both of the first and second areas 146 and 147 includes the interface region 115.

In some embodiments, a thickness (denoted as t1 in FIG. 1C) of individual layers (e.g., the first layers 126, the second layers 127) of the polymer structure 125 ranges approximately 50 to 70 microns. In some embodiments, the height (denoted as t2 in FIG. 1C) of the grooves 130 ranges approximately 50 to 70 microns. In some embodiments, the length of the overhang (denoted as t3 in FIG. 1C) ranges approximately 20 to 25 microns. In some embodiments, a first distance between the first layer 126 within the cavity 135 (i.e., the first distance corresponding to the first opening 136) ranges approximately 120 to 140 microns. In some embodiments, a second distance between the second layer 127 within the cavity 135 (i.e., the second distance corresponding to the second opening 137) ranges approximately 80 to 100 microns.

Although foregoing example embodiments illustrated in FIGS. 1A through 1D include six (6) polymer layers, the present disclosure is not limited thereto. For example, the polymer structure 125 may include at least two or more polymer layers—e.g., two (2) layers, three (3) layers, eight (8) layers, ten (10) layers, or even greater quantity of polymer layers. Moreover, although the polymer structure 125 of the example embodiments of FIGS. 1A through 1D has a circular shape (a ring shape), the polymer structure 125 may have other shapes, for example, shapes of a race track, a polygon, a polygon with round corners, an ellipse, or an obround, or the like.

In some embodiments, individual polymer layers may include the same polymer material. In some embodiments, at least one or more polymer layers may comprise different polymer materials than other polymer layers. For example, the polymer layers located nearer to the top surface 111 of the semiconductor die 110 may include polymer materials configured to withstand against greater force (e.g., applied by a roller as described with reference to FIGS. 2B and 2F) without deformation when compared to the polymer layers located away from the top surface 111. In this manner, the laminate process may be repeated multiple times with less risk of adversely impacting shapes of underlying polymer layers.

Figure 2A:
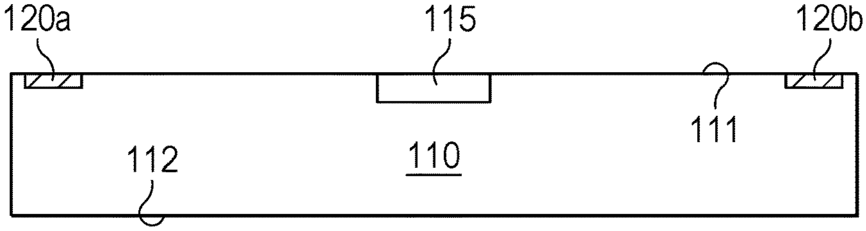
FIGS. 2A through 2L illustrate process steps of making semiconductor packages in accordance with embodiments of the present disclosure.

FIGS. 2A through 2L illustrate process steps of making semiconductor packages in accordance with embodiments of the present disclosure. Although FIGS. 2A-2J illustrate a single semiconductor die (e.g., the semiconductor die 110 described with reference to FIGS. 1A-1D) and how to form a polymer structure (e.g., the polymer structure 125 described with reference to FIGS. 1A-1D) on the single semiconductor die, the process steps described herein are applicable for a wafer including multitudes of the semiconductor dies (e.g., a wafer or a substrate including several hundreds of the semiconductor dies). In some embodiments, the wafer may have been thinned—e.g., by removing the bulk of the wafer from the back side. FIG. 2A illustrates the semiconductor die 110 with the first side 111 (or the top surface 111). The semiconductor die 110 includes the active region 115 and the bond pads 120 on the first side 111.

Figure 2B:
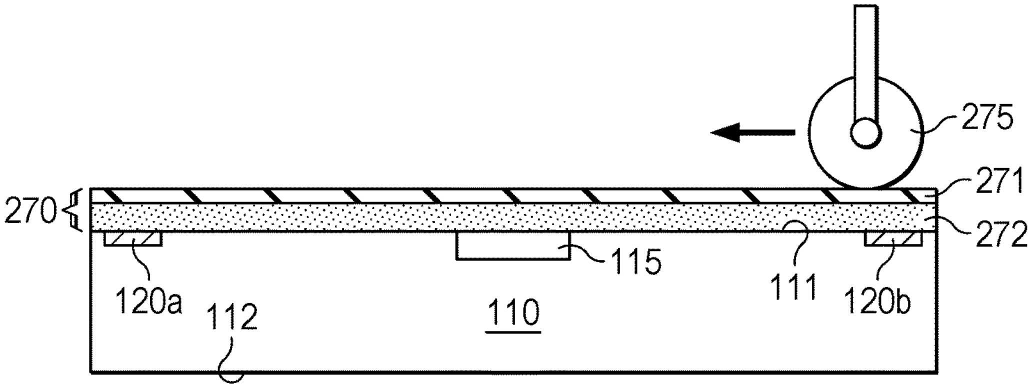

FIG. 2B illustrates that a first film 270 is applied to the first side 111 of the semiconductor die 110. The first film 270 may include a first light-sensitive polymer layer 272 (or a first polymer layer 272) facing the first side 111 and a first protection layer 271. In some embodiments, a roller 275 may be used to apply pressure to the first film 270 (i.e., the first protection layer 271 of the first film 270) to attach the first film 270 to the first side 111 of the semiconductor die 110. The first protection layer 271 can be configured to protect the first light-sensitive polymer layer 272—e.g., when the roller 275 presses upon the first film 270. Thereafter, the first protection layer 271 can be removed.

Figure 2C:
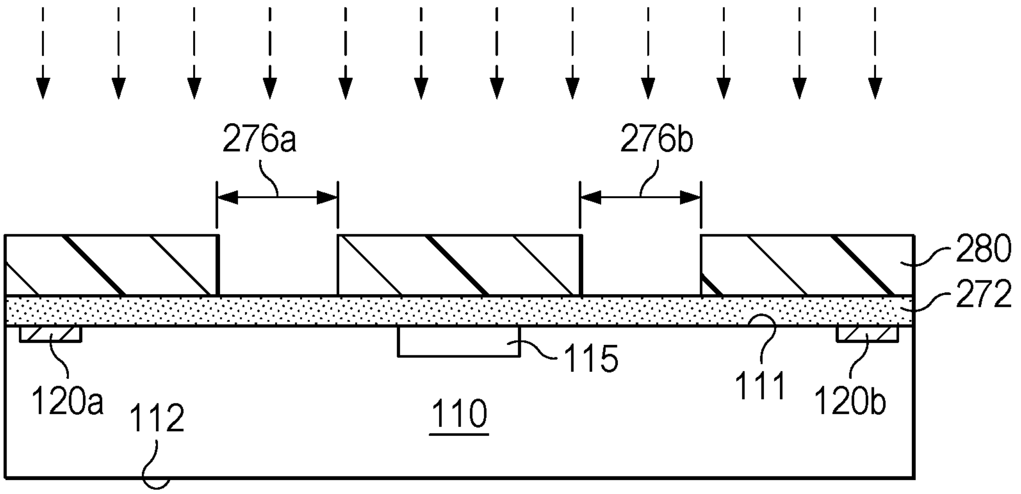
Figure 2D:
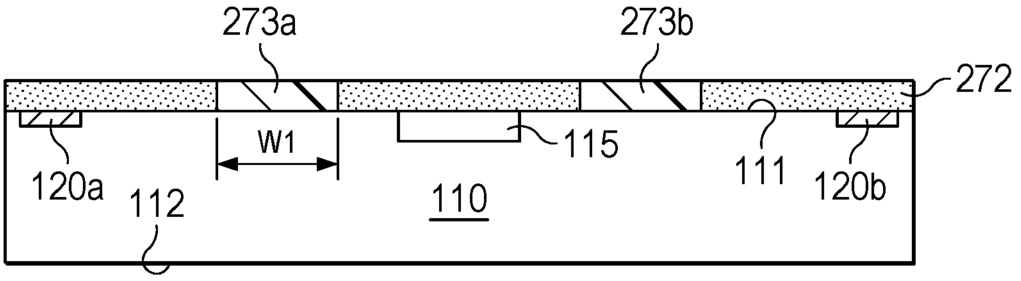
Figure 2E:
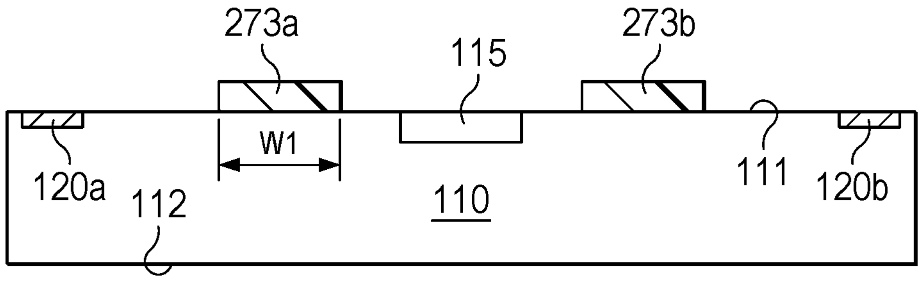

FIGS. 2C-2E illustrate patterning of the first light-sensitive polymer layer 272. FIG. 2C illustrates that a first mask 280 (or a first reticle 280) is used to shine light (depicted as a set of downward arrows in FIG. 2C) to targeted portions of the first light-sensitive polymer layer 272—e.g., the remaining portions 273 (also identified individually as remaining portions 273*a/b*) depicted in FIG. 2E. In some embodiments, the light includes UV light. In some embodiments, the first mask 280 comprises quartz. The first mask 280 includes openings 276 (also identified individually as openings 276*a/b*) that expose the targeted portions of the first light-sensitive polymer layer 272 to the light. In other words, the first mask 280 blocks the light from reaching the rest of the first light-sensitive polymer layer 272.

Subsequently, the first light-sensitive polymer layer 272 is cured to strengthen the targeted portions of the first light-sensitive polymer layer 272 as depicted in FIG. 2D—e.g., cross-linking the polymer compounds of the polymer layer 272 in response to the light exposure. As such, the targeted portions (i.e., the portions exposed to the light and subsequently cured) can remain on the first side 111 of the semiconductor die 110 after completing develop process steps following the curing step. In some embodiments, the first light-sensitive polymer layer 272 is cured for approximately an hour at a temperature range between 200 to 300 degree-C(° C.).

FIG. 2E illustrates that the targeted portions of the first light-sensitive polymer layer 272 remain after the develop process step configured to remove unexposed portions of the first light-sensitive polymer layer 272—e.g., the portions of the first light-sensitive polymer layer 272 including the polymer compounds that are not cross-linked. The width of the remaining portions 273 corresponds to the first width W1 described with reference to FIG. 1C.

Figure 2F:
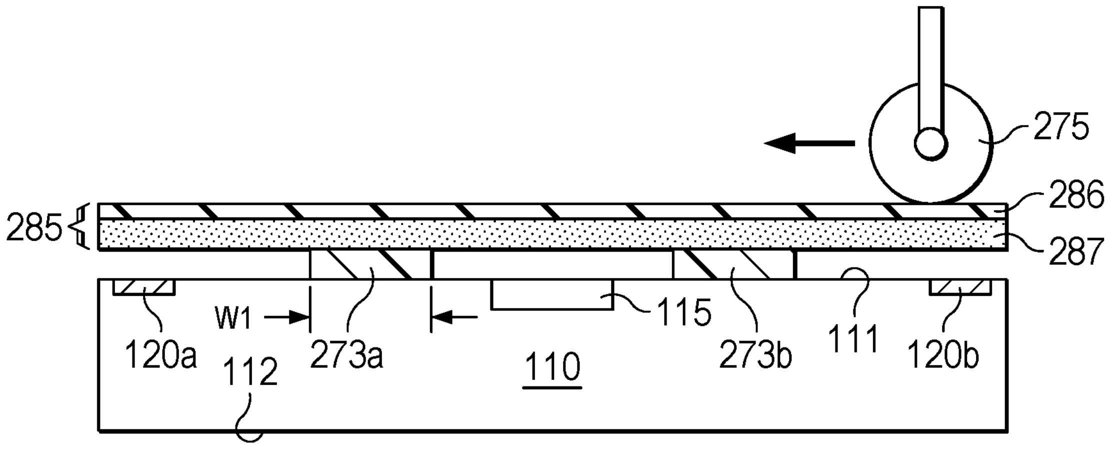

FIG. 2F illustrates that a second film 285 is attached to the remaining portions 273 of the first light-sensitive film 270. Similar to the first film 270, the second film 285 may include a second light-sensitive polymer layer 287 and a second protection layer 286 configured to protect the second light-sensitive polymer layer 287. The second light-sensitive polymer layer 287 faces the remaining portions 273 of the first light-sensitive polymer layer 272. In some embodiments, the roller 275 may be used to apply pressure to the second film 285 (i.e., the first protection layer 286 of the first film 270) to attach the second film 285 to the remaining portions 273 of the first light-sensitive layer 272. The remaining portions 273 of the first light-sensitive layer 272 may be configured to withstand the laminate process using the roller 275 without deformation—e.g., collapsing or otherwise being distorted when compared to the shape immediately after the develop process. Moreover, the second film 285 may be configured to maintain its planarity against the pressure applied by the roller 275 without sinking (or conforming) into the empty space between the remaining portions 273. Thereafter, the second protection layer 286 may be removed.

Figure 2G:
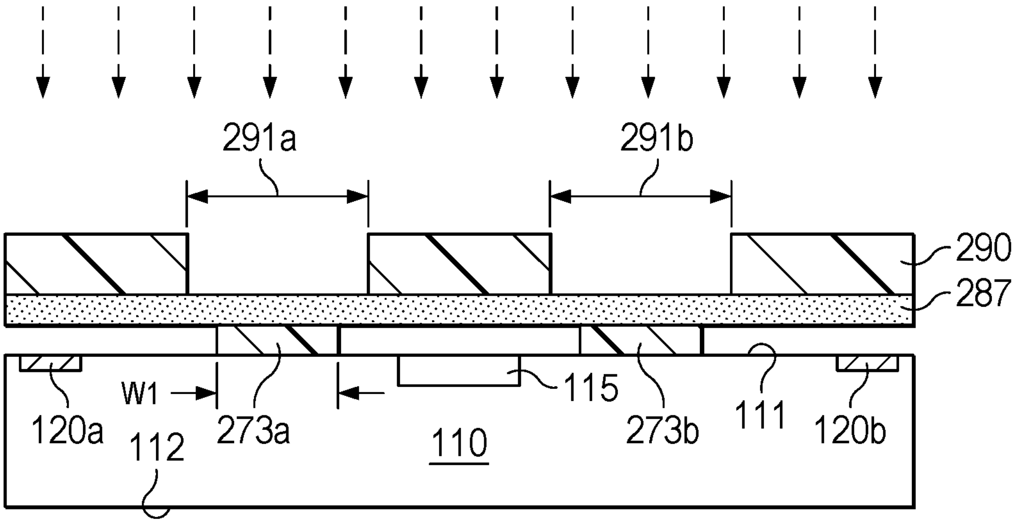
Figure 2H:
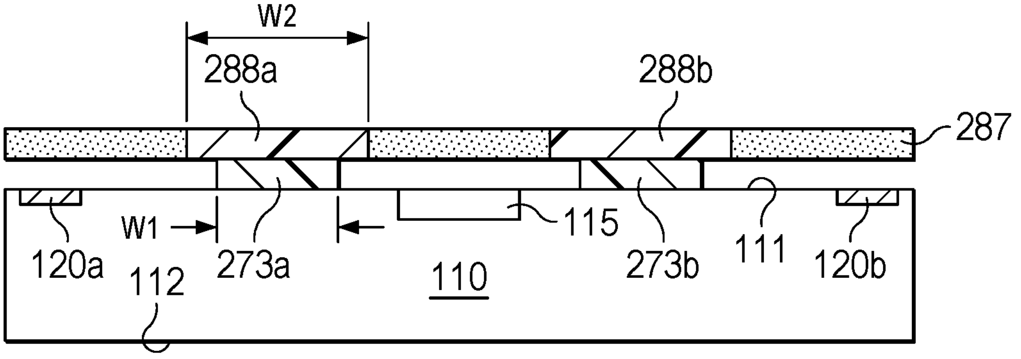
Figure 2I:
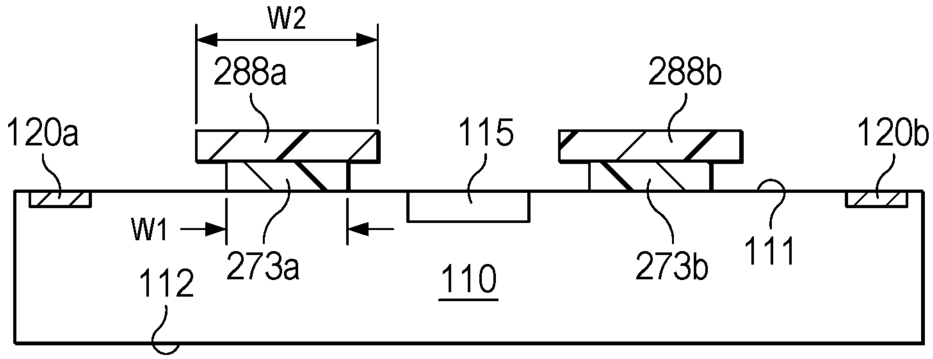

FIGS. 2G-2I illustrate patterning of the second light-sensitive polymer layer 287. FIG. 2G illustrates that a second mask 290 (or a second reticle 290) is used to shine light (depicted as a set of downward arrows in FIG. 2G) to targeted portions of the second light-sensitive polymer layer 287—e.g., the remaining portions 288 (also identified individually as remaining portions 288*a/b*) depicted in FIG. 2I. In some embodiments, the light includes UV light. The second mask 290 may comprise quartz. The second mask 290 includes openings 291 (also identified individually as openings 291*a/b*) that expose the targeted portions of the second light-sensitive polymer layer 287 to the light.

FIG. 2H illustrates that the second light-sensitive polymer layer 287 is cured to strengthen the exposed portions of the second light-sensitive polymer layer 287 such that the targeted portions (i.e., the portion exposed to the light) can remain during the subsequent develop process step—e.g., cross-linking the polymer compounds of the second light-sensitive polymer layer 287. In some embodiments, the second light-sensitive polymer layer 287 is cured for approximately an hour at a temperature range between 200 to 300 degree-C(° C.).

FIG. 2I illustrates that the targeted portions of the second light-sensitive polymer layer 287 remain after the develop process step. The width of the remaining portions 288 corresponds to the second width W2 described with reference to FIG. 1C.

Figure 2J:
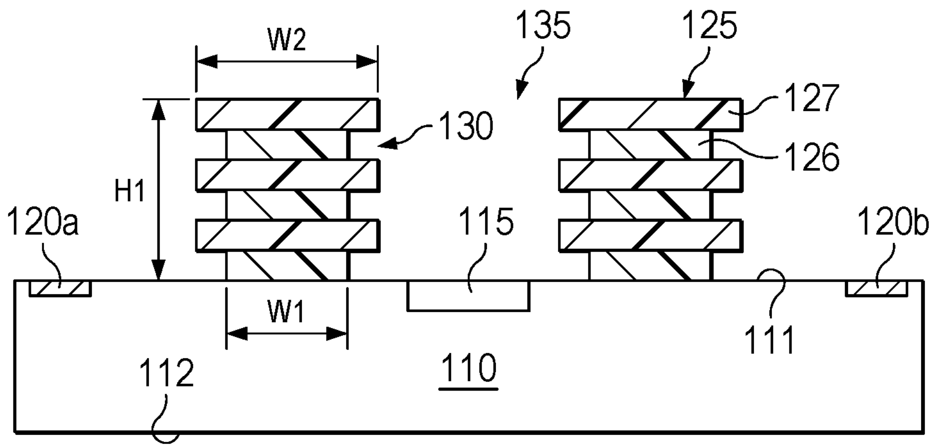

FIG. 2J illustrates the polymer structure 125 that has been completed—e.g., by repeating the laminate process steps described above three (3) times. The polymer structure 125 includes the cavity 135 described with reference to FIGS. 1A-1D. After forming the polymer structure 125, individual semiconductor dies 110 may be singulated (e.g., diced) from the wafer.

Figure 2K:
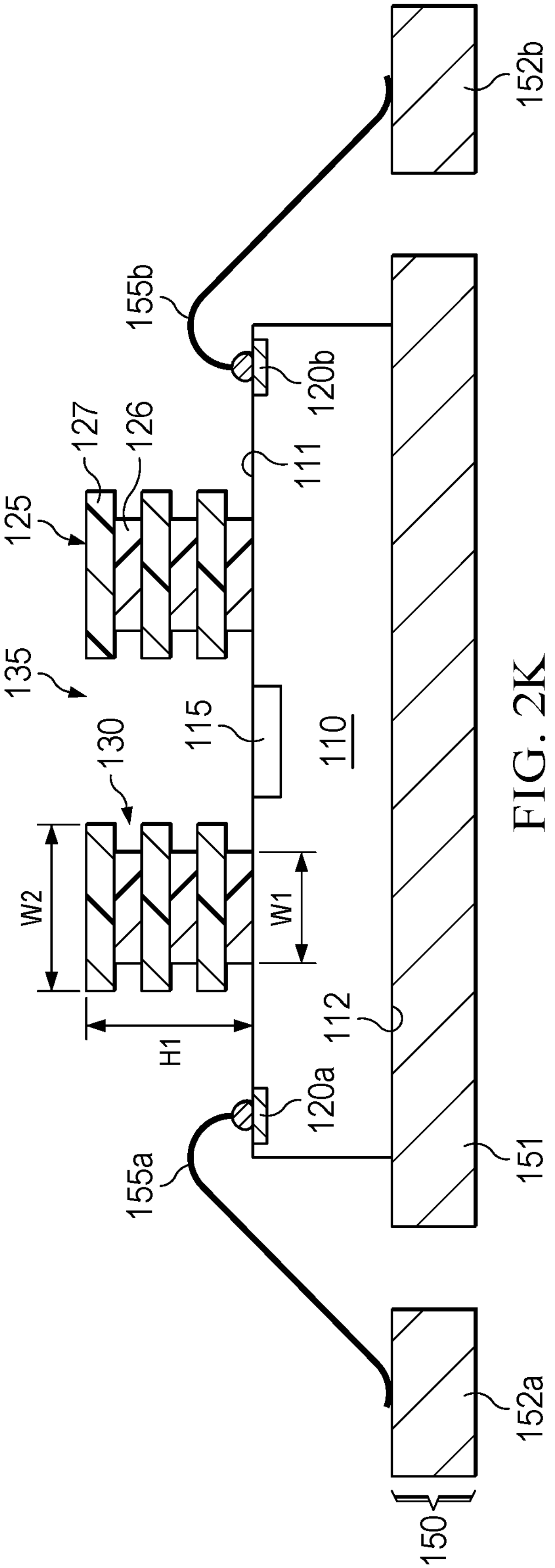

FIG. 2K illustrates that the semiconductor die 110 is attached to the lead frame 150—e.g., using an adhesive layer (not shown). In some embodiments, the lead frame 150 is configured to have two or more semiconductor dies 110 attached thereto—e.g., prior to being singulated into individual semiconductor packages 105. Moreover, bond wires 155 are formed to connect the bond pads 120 to corresponding lead fingers 152.

Figure 2L:
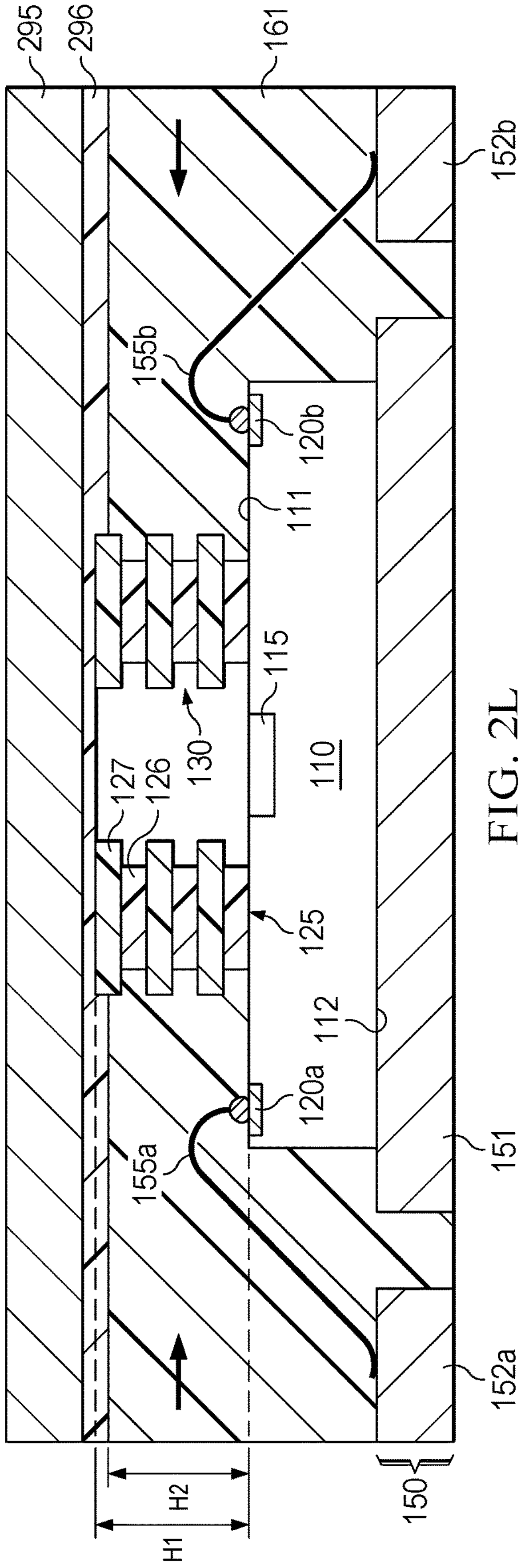

FIG. 2L illustrates that a mold chase 295 is applied to the lead frame 150 with the semiconductor die 110 attached thereto to form the encapsulation structure 160 by injecting a mold compound 161 (as indicated by the lateral arrows). FIG. 2L depicts a mold release film 296 that can be disposed between the mold chase 295 and the polymer structure 125. The mold release film 296 may be configured to conform to the polymer structure 125 such that the surface profile of the mold release film 296 can keep the mold compound 161 from encroaching into the cavity 135. As such, the encapsulation structure 160 extends from the top side 111 of the semiconductor die 110 to a second height (denoted as H2 in FIGS. 1A and 2L), which is less than the first height (H1) of the polymer structure 125. Subsequently, the mold chase 295

(and the mold release film 296) is removed and individual semiconductor packages 105 may be singulated from the lead frame 150.

Although the light-sensitive polymer layers of foregoing example process steps are described to have characteristics of the UV-light exposed portions becoming insoluble during the subsequent develop process steps, which may be referred to as having a negative polarity, the present disclosure is not limited thereto. For example, the light-sensitive polymer layers may have opposite characteristics (e.g., a positive polarity)—i.e., the UV-light exposed portions becoming soluble during the subsequent develop process steps. As such, the reticles for the light-sensitive polymer layers with the positive polarity may need to be modified—e.g., to have an opposite tone.

FIGS. 3A through 3F illustrate various schematic diagrams of polymer structures formed on the semiconductor die 110 in accordance with embodiments of the present disclosure. The polymer structures 310, 325, 340, 350, 365, and 380 of FIGS. 3A through 3F are generally similar to the polymer structure 125 described with reference to FIGS. 1A through 2L. For example, each of the polymer structures 310, 325, 340, 350, 365, and 380 surrounds the interface region 115 and includes a cavity (e.g., the cavities 315, 355, 355, 370, or 385) above the interface region 115. The polymer structures 310, 325, 340, 350, 365, and 380 have an uneven inner sidewall profile. Moreover, each of the polymer structures 310, 325, 340, 350, 365, and 380 includes two or more light-sensitive polymer layers stacked on top of another, which can be formed by the process steps described with reference to FIGS. 2A through 2J.

Figure 3A:
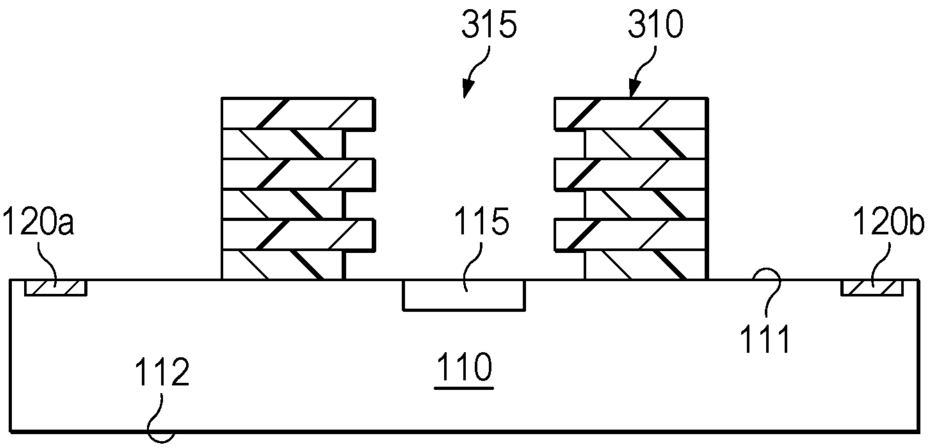
FIGS. 3A through 3F illustrate various schematic diagrams of polymer structures formed on a semiconductor die in accordance with embodiments of the present disclosure.
Figure 3B:
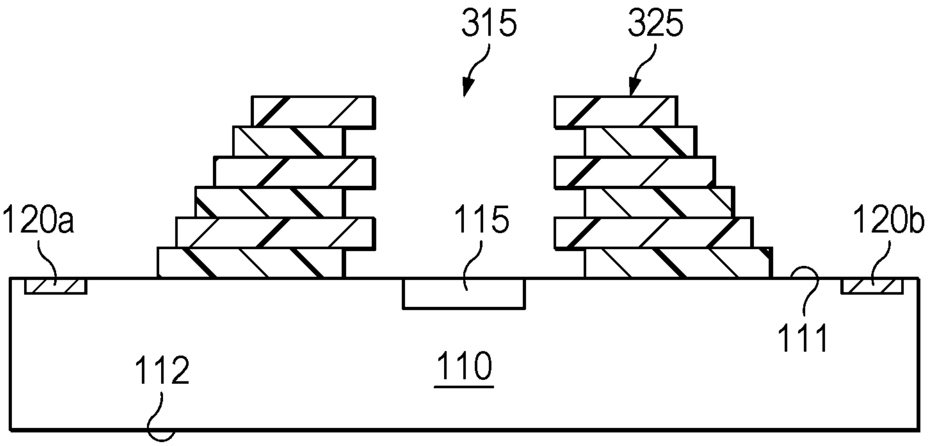
Figure 3C:
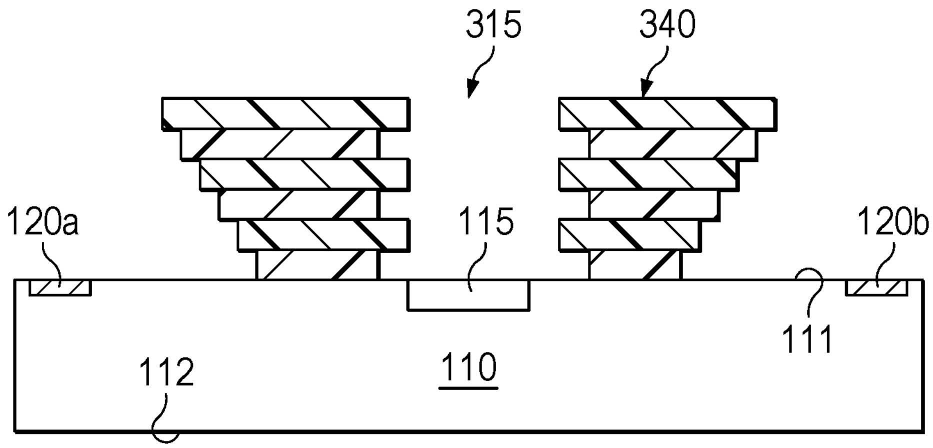
Figure 3D:
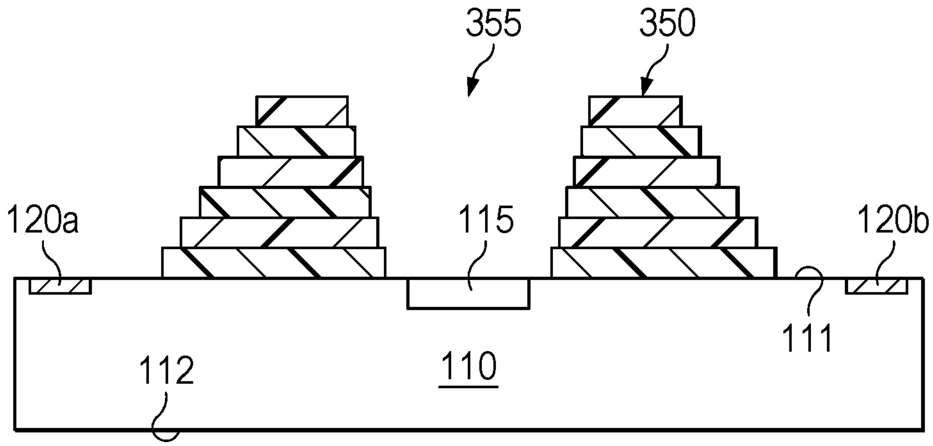

FIGS. 3A through 3C illustrate cross-sectional diagrams of polymer structures 310, 325, and 340, respectively. The polymer structures 310, 325, and 340 include outer sidewall profiles that are different than that of the polymer structure 125. For example, the polymer structure 310 of FIG. 3A has a vertical outer sidewall profile with the outer edges of each polymer layers aligned to form a straight vertical line while the uneven inner sidewall profile is maintained to have the U-shaped grooves. In some cases, the vertical outer sidewall profile may provide advantages during the assembly process—e.g., during the molding process steps forming the encapsulation structure 160 without any voids.

The polymer structure 325 of FIG. 3B has an outer sidewall profile resembling that of a pyramid. In other words, the polymer layers located relatively closer to the semiconductor die 110 may be configured to have generally greater widths than the polymer layers located farther away from the semiconductor die 110 while maintaining the uneven inner sidewall profile—e.g., with the U-shaped grooves. In some cases, the wider widths of the lower polymer layers may provide advantages during the assembly process—e.g., the lower polymer layers being able to withstand relatively greater total force applied thereto during the laminate process. Moreover, the outer sidewall profile resembling the pyramid may be advantageous to avoid forming voids during the molding process steps.

The polymer structure 340 of FIG. 3C has an outer sidewall profile opposite to the outer sidewall profile of the polymer structure 325. In other words, the polymer layers located relatively closer to the semiconductor die 110 may be configured to have generally less widths than the polymer layers located farther away from the semiconductor die 110 while maintaining the uneven inner sidewall profile—e.g., with the U-shaped grooves. In some cases, having a greater surface area of the semiconductor die 110 encased by the encapsulation structure (based on the less surface area occupied by the polymer structure 340) may be advantageous for the reliability of the semiconductor package.

The polymer structure 350 of FIG. 3D has inner and outer sidewall profiles both resembling that of a pyramid (with different slopes in some cases). In other words, each of the polymer layers may be configured to have successively decreasing widths than the preceding polymer layers. The inner sidewall profile of the polymer structure 350 may be advantageous for components located in the interface region 115 having certain projection angles—e.g., an LED, a solid-state laser. Moreover, the wider widths of the lower polymer layers may provide advantages during the assembly process—e.g., the lower polymer layers being able to withstand relatively greater total force applied thereto during the laminate process.

Figure 3E:
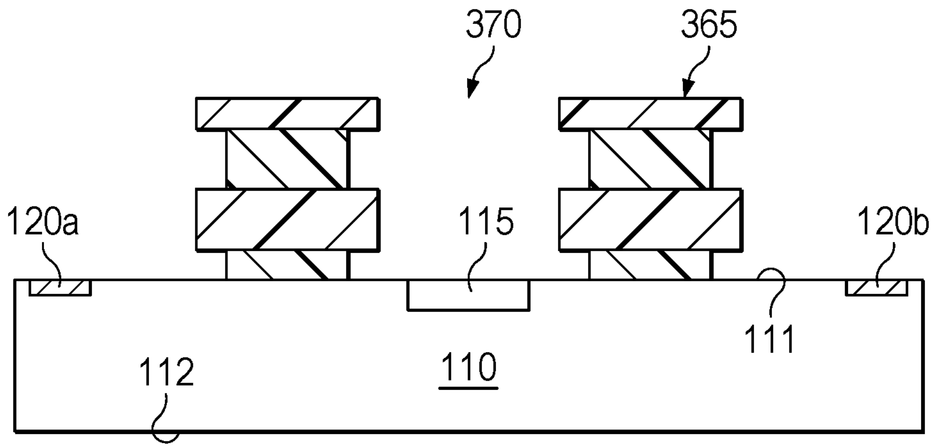
Figure 3F:
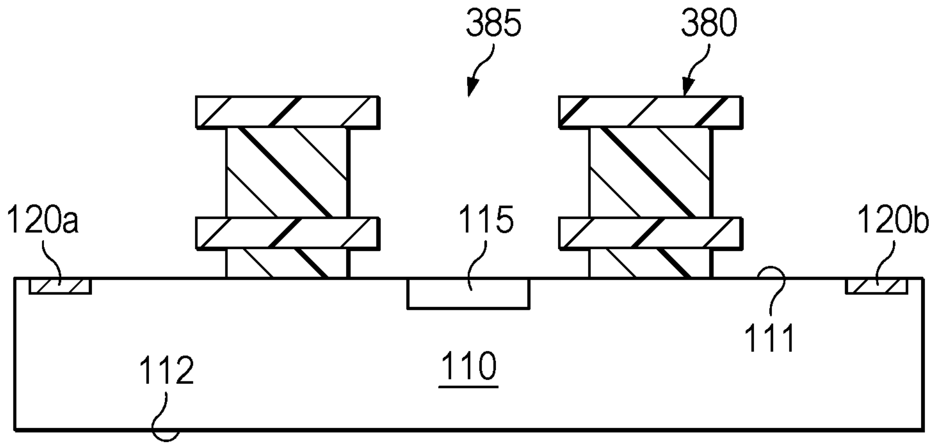

Although the foregoing example embodiments includes each polymer layers of polymer structure having approximately the same thickness, the present disclosure is not limited thereto. For example, the polymer structures 365 and 380 of FIGS. 3E and 3F illustrate that one or more polymer layers of the polymer structure may have different thicknesses, respectively. Accordingly, the laminate process described herein can be configured to make a variety of shapes and sizes of polymer structures based on different line widths and spaces at each polymer layer, different overlaps between two or more features of the polymer layers, and different thicknesses of one or more polymer layers.

Figure 4:
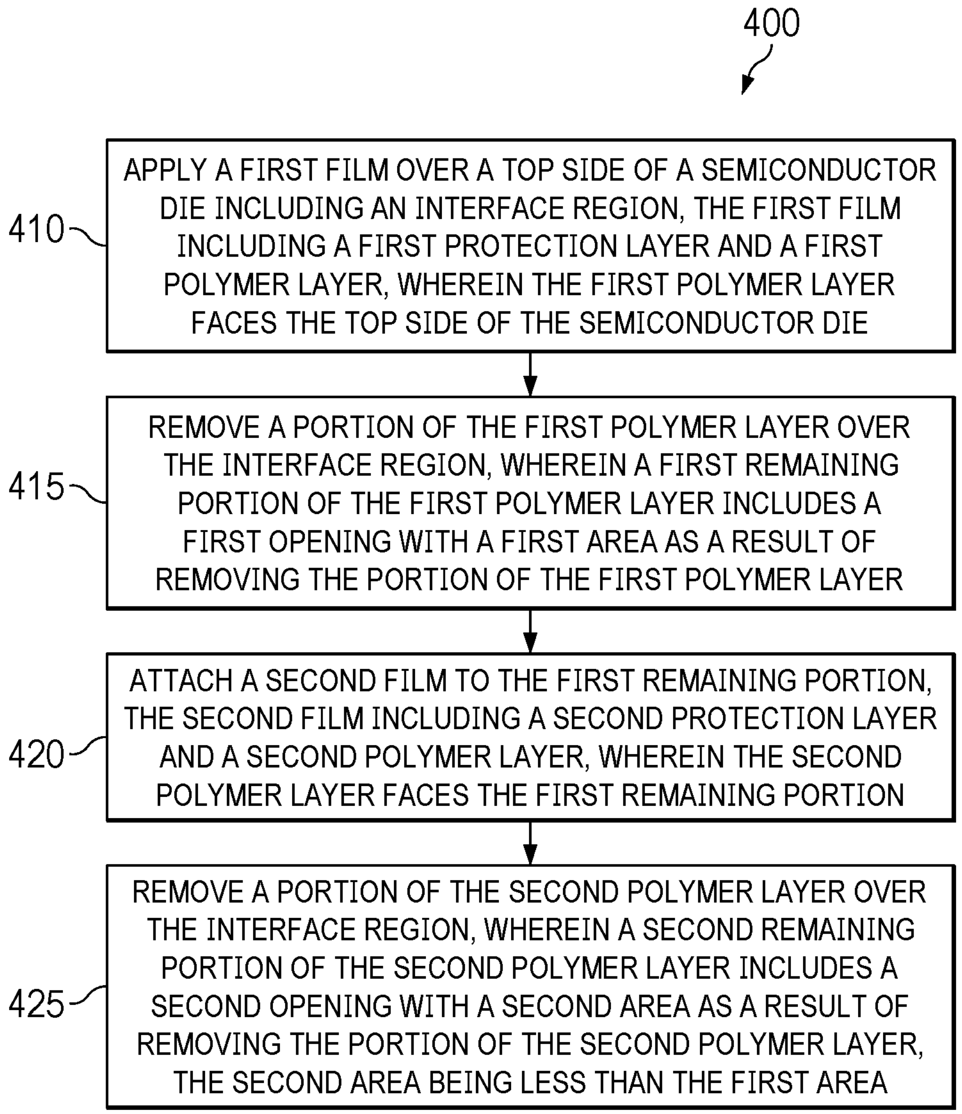
FIG. 4 is a flowchart illustrating methods of making semiconductor packages in accordance with aspects of the present disclosure.

FIG. 4 is a flowchart 400 illustrating methods of making semiconductor packages in accordance with aspects of the present disclosure. The flowchart 400 includes aspects of methods described with reference to FIGS. 2A through 2L.

The method includes applying a first film over a top side of a semiconductor die including an interface region, the first film including a first protection layer and a first polymer layer, where the first polymer layer faces the top side of the semiconductor die (box 410). The method further includes removing a portion of the first polymer layer over the interface region, where a first remaining portion of the first polymer layer includes a first opening with a first area as a result of removing the portion of the first polymer layer (box 415). The method further includes attaching a second film to the first remaining portion, the second film including a second protection layer and a second polymer layer, where the second polymer layer faces the first remaining portion (box 420). The method further includes removing a portion of the second polymer layer over the interface region, where a second remaining portion of the second polymer layer includes a second opening with a second area as a result of removing the portion of the second polymer layer, the second area being less than the first area (box 425).

In some embodiments, a third area common to the first and second areas include the interface region. In some embodiments, attaching the second film to the first remaining portion of the first polymer layer includes applying pressure to the second film placed on the first remaining portion using a roller. In some embodiments, the first or second polymer layer includes a light-sensitive polymer material. In some embodiments, the light-sensitive polymer material includes polyimide, PBO, BCB, or a combination thereof. In some embodiments, the second remaining portion includes an overhang over the first remaining portion. In some embodiments, the second remaining portion stacked on top of the first remaining portion forms at least part of a polymer structure surrounding the interface region, the polymer structure including an uneven inner sidewall profile that forms a cavity over the interface region.

In some embodiments, removing the portion of the first or second polymer layer includes shielding the portion of the first or second polymer layer from ultra-violet (UV) light applied to the first or second polymer layer using a photomask configured to block the UV light from the portion of the first or second polymer layer, and transmit the UV light to another portion of the first or second polymer layer corresponding to the first or second remaining portions.

In some embodiments, the method may further include removing selectively the portion of the first or second polymer layer based on shielding the portion of the first or second polymer layer from the UV light, and curing the first or second remaining portion of the first or second polymer layer. In some embodiments, the method may further include encapsulating the semiconductor die with a mold compound such that the mold compound extends from the top side of the semiconductor die to a height less that of the second remaining portion stacked on top of the first remaining portion, where the interface region of the semiconductor die is exposed through the first and second openings of the first and second remaining portions. In some embodiments, the method may further include removing the first protection layer of the first film prior to removing the portion of the first polymer layer over the interface region.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A semiconductor package, comprising:

a semiconductor die including an interface region at a top side of the semiconductor die;

a polymer structure formed on the top side, the polymer structure surrounding the interface region and extending from the top side to a height, wherein the polymer structure has an uneven inner sidewall profile that forms a cavity, the uneven inner sidewall profile comprising two or more troughs having perpendicular sides with respect to the top side of the semiconductor die, the perpendicular sides facing the cavity, such that the uneven inner sidewall profile includes a first diameter and a second diameter different than the first diameter; and an encapsulation structure surrounding the polymer structure and encasing the semiconductor die.

2. The semiconductor package of claim 1, wherein the polymer structure comprises two or more layers of a light-sensitive polymer material stacked on top of another.

3. The semiconductor package of claim 2, wherein the light-sensitive polymer material includes polyimide, polybenzoxazole (PBO), benzocyclobutene (BCB), or a combination thereof.

4. The semiconductor package of claim 2, wherein a thickness of individual light-sensitive polymer layers is approximately 50 to 70 microns.

5. The semiconductor package of claim 1, wherein the interface region is exposed to an environment of the semiconductor package through the cavity.

6. The semiconductor package of claim 1, wherein the cavity has a first opening with a first area and a second opening with a second area less than the first area.

7. The semiconductor package of claim 6, wherein the polymer structure comprises one or more base layers corresponding to the first opening of the cavity and one or more protruded layers corresponding to the second opening of the cavity, wherein individual base layers alternate with individual protruded layers.

8. The semiconductor package of claim 6, wherein the second area of the second opening includes the interface region of the semiconductor die.

9. The semiconductor package of claim 6, wherein the polymer structure forms a ring shape, wherein:

the first opening of the cavity has a diameter of approximately 120 to 140 microns; and the second opening of the cavity has a diameter of approximately 80 to 100 microns.

10. The semiconductor package of claim 1, wherein the uneven inner sidewall profile includes U-shaped corrugations, a ribbed surface, an undulating surface, or a combination thereof.

11. The semiconductor package of claim 1, wherein the uneven inner sidewall profile includes at least one groove configured to capture a mold compound of the encapsulation structure.

12. The semiconductor package of claim 1, wherein the encapsulation structure includes a mold compound, and wherein the cavity is free of the mold compound.

13. The semiconductor package of claim 1, further comprising:

a die pad;

at least one lead finger of a lead frame; and at least one bond wire, wherein:

the semiconductor die is attached to the die pad of the lead frame, the top side of the semiconductor die facing away from the die pad; and the at least one bond wire couples a bond pad of the semiconductor die to the at least one lead finger of the lead frame.

14. The semiconductor package of claim 1, wherein the interface region of the semiconductor die includes a humidity sensor, a temperature sensor, a light emitting diode, a solid-state laser, a photodiode, or a combination thereof.

15. The semiconductor package of claim 1, wherein the first-height of the polymer structure is approximately 120 to 180 microns.

16. The semiconductor package of claim 7, wherein a length of an overhang of the one or more protruded layers relative to the one or more base layers is approximately 20 to 25 microns.

17. The semiconductor package of claim 1, wherein:

the height is a first height; and the encapsulation structure extends from the top side to a second height less than the first height.

18. A semiconductor package, comprising:

a semiconductor die including an interface region on a surface of the semiconductor die;

a polymer wall formed on the surface, the polymer wall circumscribing the interface region and extending from the surface to a first height, wherein the polymer wall includes two or more first layers corresponding to a first cross-sectional area and one or more second layers corresponding to a second cross-sectional area different than the first cross-sectional area, the two or more first layers alternating with the one or more second layers; and a mold structure encapsulating the semiconductor die.

19. The semiconductor package of claim 18, wherein the polymer wall comprises a light-sensitive polymer material.

20. The semiconductor package of claim 18, wherein the polymer wall has a non-straight inner sidewall profile.

21. The semiconductor package of claim 18, wherein a combination of the two or more first layers and the one or more second layers forms a cavity over the interface region, and wherein the interface region is exposed to surroundings of the semiconductor package through the cavity.

22. The semiconductor package of claim 18, wherein each of the one or more second layers include a protruded portion extended with respect to the two or more first layers.

23. The semiconductor package of claim 18, wherein the two or more first layers adjacent to the one or more second layers form a trough configured to retain a mold compound of the mold structure.

24. The semiconductor package of claim 18, wherein:

the polymer wall forms a ring shape;

the first cross-sectional area has a diameter of approximately 120 to 140 microns; and the second cross-sectional area has a diameter of approximately 80 to 100 microns.

25. The semiconductor package of claim 18, wherein the interface region of the semiconductor die includes a humidity sensor, a temperature sensor, a light emitting diode, a solid-state laser, a photodiode, or a combination thereof.

26. The semiconductor package of claim 18, wherein the height of the polymer wall is approximately 120 to 180 microns.

27. The semiconductor package of claim 18, further comprising:

a die pad;

at least one lead finger of a lead frame; and at least one bond wire, wherein:

the semiconductor die is attached to the die pad of the lead frame with the surface of the semiconductor die facing away from the die pad; and the at least one bond wire couples a bond pad of the semiconductor die to the at least one lead finger of the lead frame.

28. The semiconductor package of claim 18, wherein a thickness of individual layers of the two or more first layers or the one or more second layers is approximately 50 to 70 microns.

29. The semiconductor package of claim 19, wherein the light-sensitive polymer material includes polyimide, polybenzoxazole (PBO), benzocyclobutene (BCB), or a combination thereof.

30. The semiconductor package of claim 22, wherein a length of the protruded portion is approximately 20 to 25 microns.

31. The semiconductor package of claim 18, wherein:

the height is a first height; and the mold structure extends from the surface to a second height less than the first height.

* * * * *